United States Patent [19]
Ohno et al.

[11] Patent Number: 5,161,983
[45] Date of Patent: Nov. 10, 1992

[54] LOW PROFILE SOCKET CONNECTOR

[75] Inventors: Hirofumi Ohno; Shigeru Hayashi, both of Tama, Japan

[73] Assignee: KEL Corporation, Tokyo, Japan

[21] Appl. No.: 654,091

[22] Filed: Feb. 11, 1991

[51] Int. Cl.[5] .............................................. H01R 9/09
[52] U.S. Cl. ...................................... 439/71; 439/66; 439/330; 439/591
[58] Field of Search ............................ 439/66, 68–73, 439/91, 330, 591

[56] References Cited

U.S. PATENT DOCUMENTS

| | | | |
|---|---|---|---|
| 3,960,423 | 6/1976 | Weisenburger | 439/66 |
| 4,144,648 | 3/1979 | Grovender | 439/71 |
| 4,593,961 | 6/1986 | Cosmo | 439/66 |
| 4,643,499 | 2/1987 | Mitchell | 439/71 |

*Primary Examiner*—Paula A. Bradley
*Attorney, Agent, or Firm*—Robert W. J. Usher

[57] ABSTRACT

A low profile socket connector includes a plastic, rectangular, frame-like base member (11) having substantially rigid walls (21,22,23,24) defining between them a socket (20), receiving an LGA device (16) in coplanar relation. Beam springs (34,35), integrally formed with two adjacent walls (22,24) adjacent one corner, protrude into the socket (20) into biassing engagement with adjacent edge portions of the LGA device (16) forcing opposite adjacent edge portions into abutment with walls (23,25) defining the opposite corner, automatically locating and maintaining the device (16) in a reference position (A). A stud-like, outer securing member (14) with flexible legs (48) is insertable in a mounting socket (38) in the base member (11) and through an aperture in a circuit board (18) and an inner securing member (15) is completely receivable in an axial passageway (43) in the outer securing member (14) to spread the legs (48) into anchoring engagement with the circuit board (18). Recesses (27,28) with retaining pins (31,32) on a lower face of the base member (11) enable secure preassembly of an elastomer connector (13) on the base member (11) prior to application to the circuit board (18).

35 Claims, 5 Drawing Sheets

LOW PROFILE SOCKET CONNECTOR

FIELD OF THE INVENTION

The invention relates to a low profile socket connector for a grid array device known as a Land Grid Array device.

BACKGROUND OF THE INVENTION

A recently developed Land Grid Array device or package (hereinafter referred to as an LGA device) comprises a rectangular ceramic plate carrying an integrated circuit of high complexity and having arrays of densely packed individual contact pads or lands located adjacent outer edges of a lower face thereof. Such device is susceptible of extreme miniaturization being, for example, 1.2 square inches in area and one tenth of an inch in thickness, while the individual pad or land size may be twenty five thousandths of an inch square ($0.025 \times 0.025$ inches). Three rows of such individual pads may be located within one fifth of an inch of respective edges of the lower face.

Clearly, therefore, great accuracy is required in aligning respective lands with respective contact pads of a circuit board.

In view of the extreme miniaturization required for electronic devices, particularly hand carried devices, severe restrictions are imposed both on across-board and above-board space. There is therefore a requirement for a low profile socket connector for an LGA device that not only occupies very little above-board space but provides the requisite security and accuracy of mounting, at the same time satisfying the requirements of ease of assembly to the circuit board and economic production in high volume by conventional mass production techniques.

U.S. Pat. No. 4,498,721 discloses an electrical connector for a planar electronic device or package comprising a generally rectangular base member providing a device-receiving socket and pressure interface connectors formed as elastomer connectors received in respective apertures in the base member, means for securing the base member on a circuit board, and a spring lid engageable with the securing means for mounting on the base member by engagement with the securing means while pressing the device against the elastomer connector to effect electrical connection between the device, the elastomer connector and the circuit board.

However, disadvantages of the prior connector include the absence of any means positively locating the device in a lateral reference position, in coordinates in its plane. Accurate lateral positioning would, therefore, apparently depend on the closeness or preciseness of the fit of the device in the socket of the base member, which approach imposes severe limitations on the accommodation of even the small variations in dimension which would occur, even in the event of industry standardization, as a result of manufacturing tolerances. In consequence, undesirable limitations are imposed on contact size and density and, absent effective standardization, industry wide compatibility.

Further disadvantages associated with the prior connector follow from the securing means relying on four threaded bolts which are time consuming to apply, with risk of over-tightening, a requirement for considerable above-board space to provide clearance for access during assembly and disassembly; protrusion of the bolt heads above the base member, increasing the intrinsic above-board height; and, the absence of means for reliably retaining the four, separate, elastomer pieces preassembled with the base member, prior to mounting on the circuit board, which increases assembly time.

SUMMARY OF THE INVENTION

An object of the invention is to provide an LGA socket connector of extremely low profile which will mount the LGA device accurately with a requisite pressure interface connector on a circuit board.

Another object of the invention is to provide an LGA socket connector requiring few separate parts, each adapted for manufacture by conventional mass production techniques, which is easy to assemble and disassemble on the circuit board.

A further object of the invention is to provide a low profile LGA socket connector which is adapted for easy insertion of a correctly aligned LGA device, manually or by automatic handling techniques, but which resists insertion of one incorrectly oriented.

According to one aspect of the invention, there is provided a low profile socket connector for mounting an LGA device on a circuit board comprising a base member comprising a rectangular housing frame having upper and lower faces and opposite side walls and opposite end walls defining between them a socket opening to the upper and lower faces for receiving the LGA device in substantially coplanar relation therein with the contact land array of the LGA device exposed to the lower face, resilient biasing means protruding into the socket for resilient engagement with at least one side edge portion of the LGA device to bias the LGA device laterally into a predetermined reference position in the base member; an interface pressure connecting device positionable between a lower face of the LGA device and a circuit board; and, means for securing the base member to the circuit board with the interface device pressed between respective contact lands of the LGA device and conductive pads of the circuit board to establish electrical connection therebetween.

Accurate positioning of the LGA device in the socket is thereby ensured without a requirement for time consuming adjustment during assembly.

Preferably, the base member is made in one piece of plastic material and the resilient biasing means comprises at least one and, preferably, two, resilient plastic portions extending from adjacent inner edge portions of one pair of adjacent side walls arranged to urge the LGA device against the corner of the housing frame diametrically opposite to the corner defined between the adjacent side walls. Each resilient plastic portion may be formed as a beam spring protruding or bowing into the socket formation of the beam spring being advantageously, formed by an edge of an aperture defined in the side wall.

Such base member can therefore be manufactured economically in a single molding shot.

According to another preferred form of the invention, the interface connector device comprises an elastomer connector and means are provided on a lower face of the base member for retaining the elastomer connector thereon prior to application to a circuit board. Such means may comprise recesses formed in respective opposite walls of the base member and retaining pins may extend from walls of such recesses for receipt as force fits in respective retaining apertures provided in the elastomer connector.

The facility of preassembling the elastomer interface connector with the base member affords a considerable saving of time and avoids a requirement to manipulate the parts separately when mounting on the face of the circuit board with a commensurate reduction of applied cost.

In another preferred example of the invention, walls of the base member are formed with mounting sockets extending between upper and lower faces thereof and the securing means comprises an outer, stud-like member having a head and a shank extending from the head, a free end of the shank being formed with a plurality of axially extending, resilient legs, and a passageway extending axially through the head into the shank; an inner member including a shank extending from a head, the outer member being mountable in the base member with the head secured in the base member and the shank extending through a respective aperture with the legs received in an aperture in the circuit board and the inner member being mountable in the outer member for movement from a first position, in which the shank is partially received in the passageway to a second, anchoring position in which the shank is fully received in the passageway with a free end thereof spreading the legs radially apart into anchoring engagement with the circuit board.

The use of a securing device of this kind, enables an extremely low height to be achieved, while avoiding a requirement for time consuming manipulation of screws as complete assembly of the inner member within the outer member can be achieved by a simple, linear, pushing action. In addition, each part can simply be molded from plastic material with commensurate savings in cost and weight when compared with a threaded metal part.

Another preferred embodiment further comprises a cover member stamped and formed from a single piece of sheet metal and comprising a rectangular, plate-like, resilient frame portion having opposite side walls and opposite end walls, inner edge portions of which overhang corresponding walls of the base member to extend over the socket and are formed with a plurality of protuberances extending, at spaced apart locations from a lower face thereof, into the socket; a plurality of keyhole type mounting apertures having wide entry portions communicating with narrow slot-like retention portions formed in the cover member, the securing means comprising stud-like members each having shanks extending from cover member retaining heads; whereby the cover member can be located on the base member in a first position in which the heads are freely received in the respective entry portions of the mounting apertures and, subsequently, urged along the base member in a sliding action, parallel to the circuit board, to a second, fastening position, in which the shanks are received in the retention portions and the protuberances engage an upper face of an LGA device in the socket with flexure of the cover plate, the resiliency thereof pressing the LGA device against the interface connector.

The cover member is extremely inexpensive to manufacture and can quickly be applied to the base member by sliding parallel to the face of the circuit board, affording both assembly and disassembly, (for replacement of a LGA device), in extremely restricted locations. The resilient nature of the plate-like cover member together with the distributed force applying protuberances or beads ensures that an evenly distributed pressure is applied to the interface connector assuring reliable connection to all conductive lands of the LGA device.

BRIEF DESCRIPTION OF THE DRAWINGS

A specific example of an LGA socket connector will now be described with reference to the accompanying drawings in which.

Figure 1:
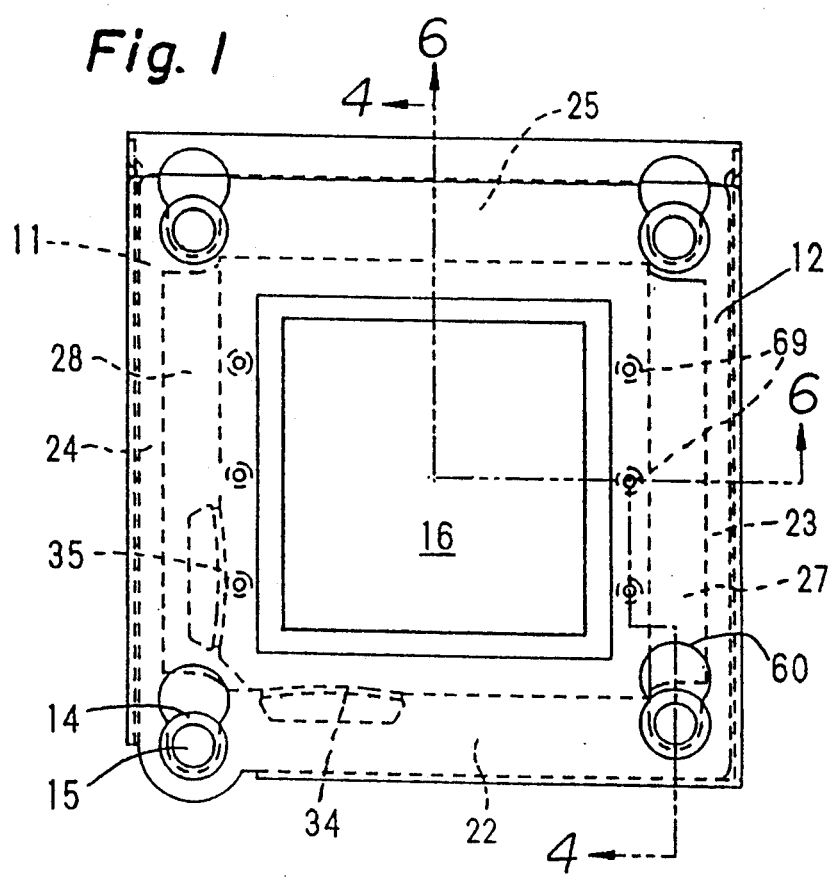
FIG. 1 is a plan view of the assembled connector.
Figure 2:
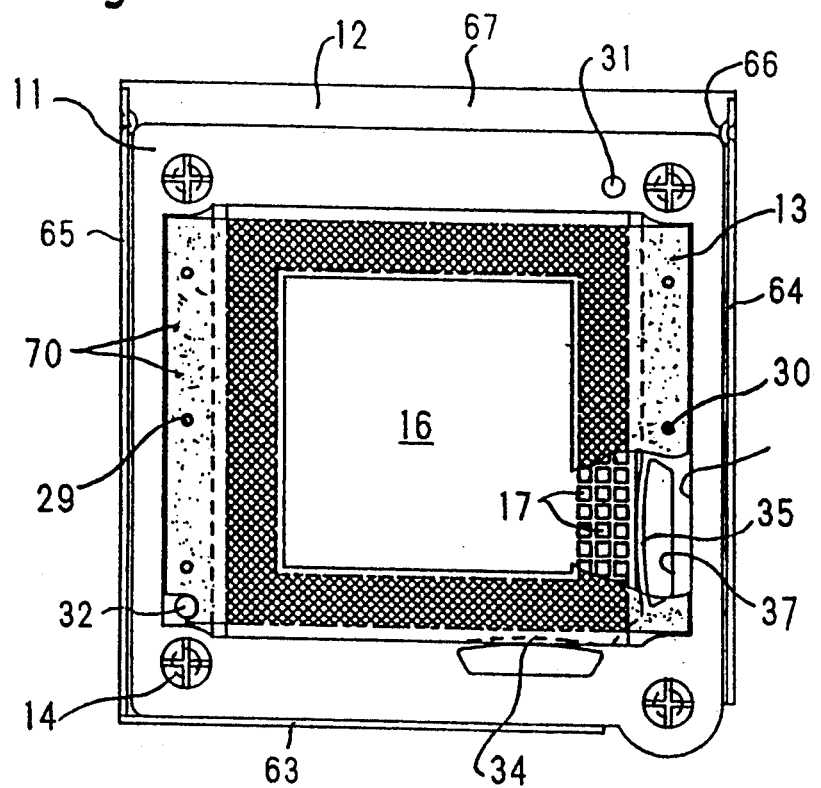
FIG. 2 is an underplan view partly broken away.
Figure 3:
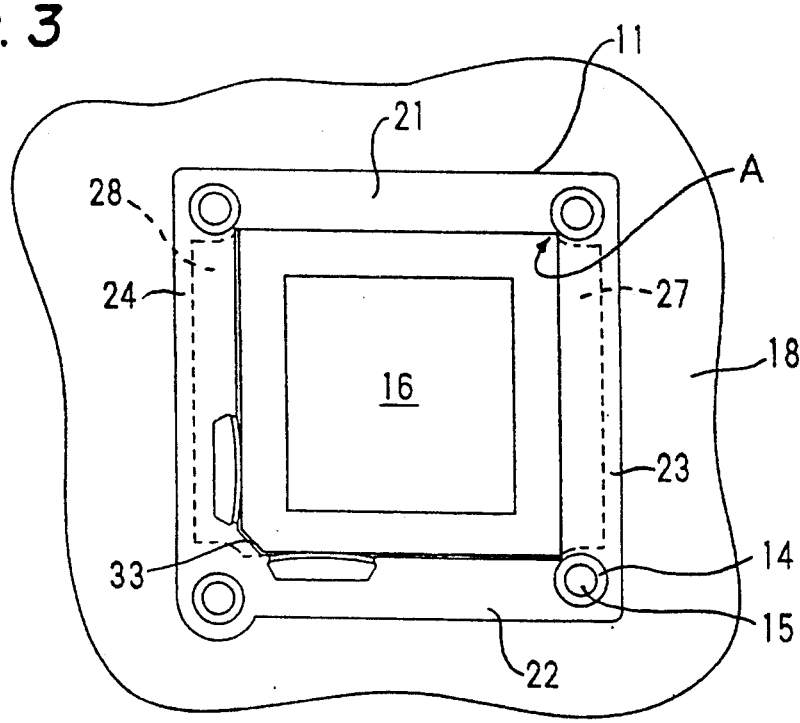
FIG. 3 is a plan view of the connector assembly mounted on a circuit board with a cover member of the assembly removed to expose an LGA device.

As shown most clearly in FIGS. 1-6, the connector comprises three main parts consisting of a base member 11 for receiving a Land Grid Array device 16 (hereinafter referred to as an LGA device); a cover member 12 adapted for attachment to the base member to secure the LGA device in the base member 11; and, an elastomer interface connector 13 mounted in the base member 11 for effecting electrical connection of the respective individual conductive Lands 17 of the LGA device 16 with respective conductive pads of a circuit board 18.

Securing devices, which may be pre-assembled with the base-member 11, for securing the connector parts together about an LGA device and against the face of the circuit board 18, each include an outer securing member 14 and an inner securing member 15 for cooperative fastening receipt within the outer securing member 14.

As shown particularly in FIG. 7(a)-(d), the base member 11 is molded in one piece of plastic material and consists of a rectangular frame constituted by opposite side walls 21 and 22 and opposite end walls 23 and 24, defining between them a socket 20 open to upper and lower faces 25 and 26, respectively, of the base member 11. Lower faces of the end walls 23 and 24 are rebated or undercut for substantially their entire length to provide inwardly and downwardly opening recesses 27 and 28, respectively, for receiving opposite ends of the elastomer connector 13. Outer extremities of the recesses 27 and 28 are of less length than the length of the inner edges of the side walls 23 and 24 to provide a coding or polarizing feature to ensure initial receipt of the elastomer connector in correct alignment. Upper wall surfaces of respective recesses 27 and 28 are integrally formed with rows of depending, elastomer connector retaining pins 29 and 30.

Positioning pins 31 and 32 for receipt in locating apertures in the circuit board accurately to position the connector assembly thereon and from the lower face of side wall 21 and from the rebated portion of end wall 23.

Although not shown in the drawings, it will be appreciated that each retaining pin 29,30 may be formed with an enlarged free end portion to assist in reliable retention of the elastomer connector thereon.

A coding land 33 extends across one corner of the base member 11 between adjacent side and end walls 22 and 24, respectively, and longitudinally extending, inwardly bowed beam spring members 34 and 35 are integrally formed on inner edge portions of those walls, respectively, at locations adjacent the land 33 by forming elongate, slot-form through-apertures 36 and 37 in the walls adjacent such inner edges during molding. As a result of the rebates, the beam spring 34 is of greater thickness, as measured between upper and lower faces of the base member 11, than the beam spring 35.

In operation, the beam springs engage adjacent side edges of an LGA device 16 inserted in the base-member to bias the LGA device 16 towards an opposite corner A (FIG. 3) which constitutes the cardinal or reference point of the LGA device 16 on the circuit board 18. Upper edges of the beam springs 34 and 35 are bevelled or tapered to facilitate insertion of the LGA device through the upper face 25 into the socket 20.

Four, circular, mounting sockets extend through respective corners of the base member 11, three mounting sockets 38 being located symmetrically and the fourth socket 38', asymmetrically, in an extended portion of side wall 22 to afford polarizing or coding. Each mounting socket is counter-bored at the upper face 25 to provide a seat 40 for a head of the outer member of the securing device.

Figure 10A:
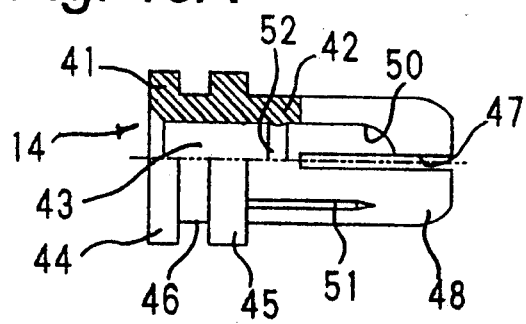
FIG. 10(a) and 10(b) is a partly cross-sectional view and an end elevational view of an outer member of a securing device for fastening the connector to a circuit board, the cross-section being taken along line 10B—10B of FIG. 10(b); and, FIG. 11(a) and 11(b) is a side elevational and end view of an inner member of the securing device.
Figure 10B:
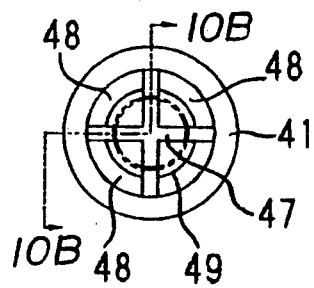

As shown most clearly in FIGS. 10(a) and 10(b), the outer member 14 of each securing device is molded from one piece of plastic material and comprises a head portion 41 from which extends a shank portion 42. An axial passageway 43 extends through the head and part way into the shank portion 42. The head portion 41 is formed with upper and lower, radially extending, annular flanges 44 and 45, respectively, which are axially spaced apart to define between them a neck or annular cover member locating groove 46. A cruciform slot 47 extends axially of the shank portion 42 from a free end thereof into communication with the passageway 43, dividing the free end portion of the shank portion into four resilient legs 48. An entry end of the passageway 43, is formed with an annular recess 49 while the opposite end terminates in camming surfaces 50 on respective legs 48. Four, circumferentially spaced, friction mounting beads 51 extend from the lower flange 45 along the outer surface of the shank portion 42 to a location approximately medial of each resilient leg 48. A portion of the passageway 43 within the shank portion 42 is constricted by a radially inwardly protruding annular rib 52.

Figure 11A:
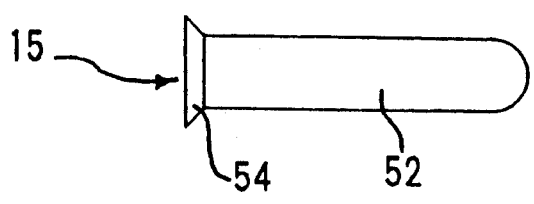
Figure 11B:
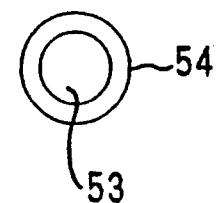

As shown in FIG. 11(a) and 11(b), the inner member 15 comprises an elongate shank 53, of greater length than the passageway 43, and extending from an enlarged head portion 54. The shank is sized for receipt in the passageway 43 as a force fit with the annular rib 52, thereby to retain the inner member pre-loaded in the outer member prior to assembly with the circuit board.

Figure 8A:
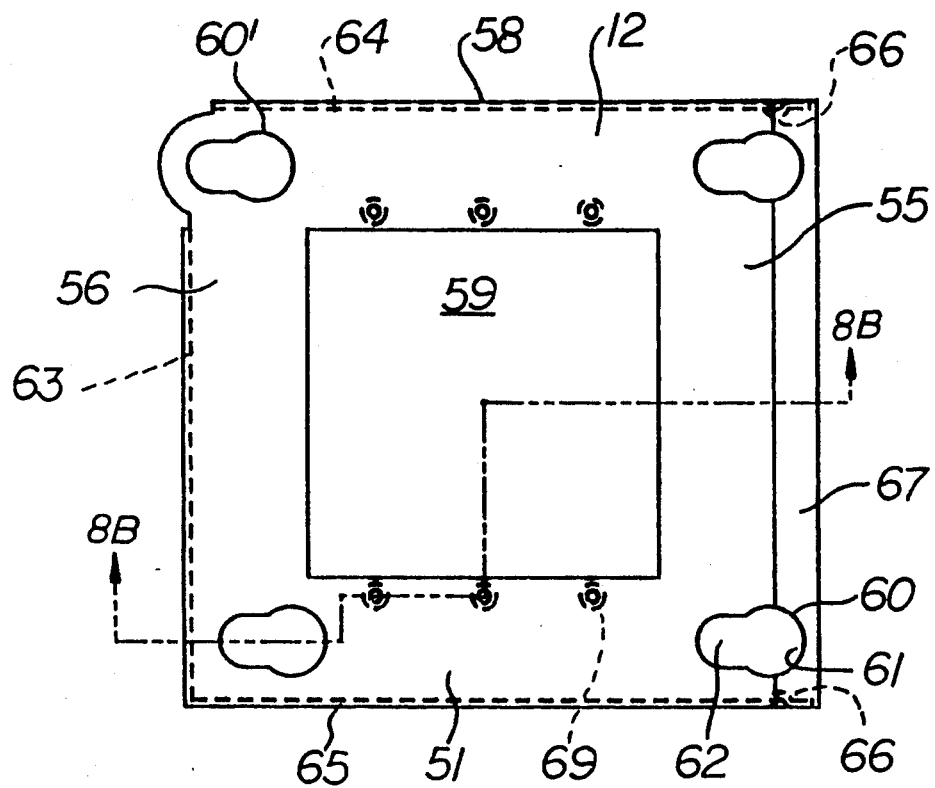
FIG. 8(a) and 8(b) is a plan and cross-sectional view of a cover member of the connector assembly, the cross-sectional view being taken along lines 8B—8B of FIG. 8(a)
Figure 8B:
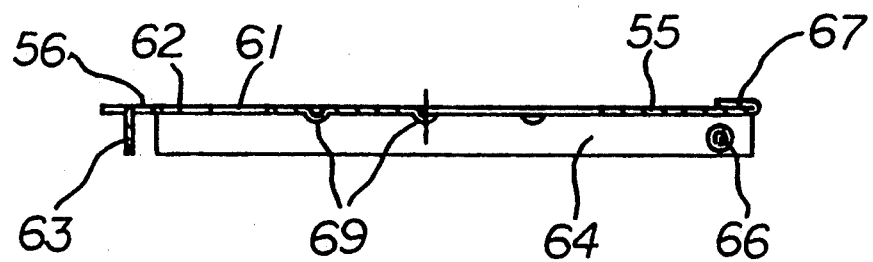

As shown particularly in FIG. 8(a) and 8(b), the cover member 12 is a stamped and formed, springy metal plate of rectangular shape having opposite side walls 55 and 56, and opposite end walls 57 and 58, defining between them a central aperture 59. Key-hole shape mounting apertures 60 are formed in respective corners thereof and each has a part circular entry portion 61 communicating with a slot-form retaining portion 62. One mounting aperture 60' is asymmetrically located in an extended portion of end wall 58 for coding or polarizing purposes. A stop flange 63 and a pair of guiding flanges 64 and 65, respectively, are bent down from an outer longitudinal edge of side wall 56 and respective outer longitudinal edges of end walls 57 and 58, respectively. Small, catch-forming, protuberances or beads 66 are impressed in locating flanges 65 adjacent a leading outer edge of side wall 55, which is reversely bent to provide a leading edge portion 67 of double thickness.

The widths of the side walls 55 and 56 and end walls 57 and 58 are greater than the widths of the corresponding walls of the base member 11 so that inner edge portions of the cover member overhang corresponding edge portions of the base member and protuberances or beads 69 are impressed in the overhanging portions of side walls 55 to extend parallel and adjacent inner edge portions thereof.

Figure 9:
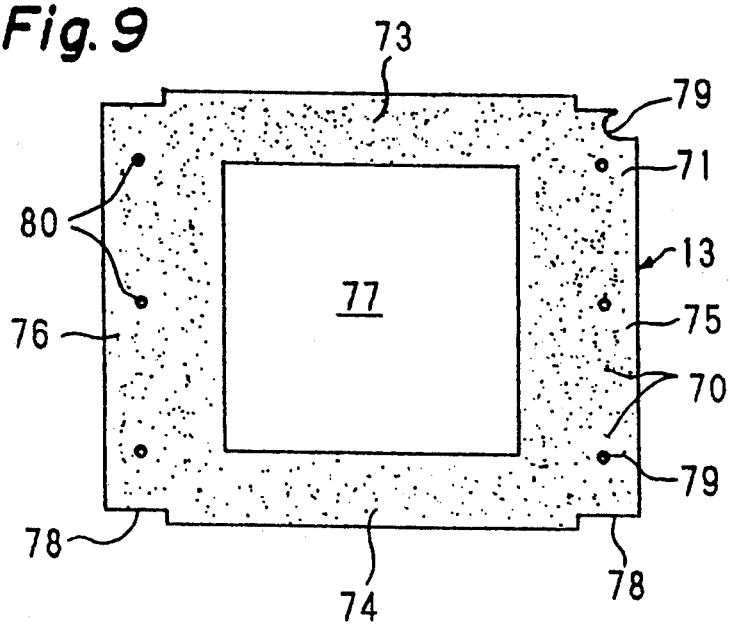
FIG. 9 is a plan view of an elastomer connector of the connector assembly.

As shown in FIG. 9, the elastomer connector 13 is of generally conventional type having a series of wire-like conductors 70 extending between opposite faces of an elastomeric pad or sheet 71. The pad or sheet is of generally rectangular shape having opposite side strip portions 73 and 74 and opposite end strip portions 75 and 76, respectively, defining between then a central aperture 77. Polarizing cut-outs providing insets 78 are formed in each corner for receiving correspondingly configured portions of the base member when mounted therein, one inset 79 being configured for receipt of positioning pin 32. Apertures 80, for receiving retaining pins 29 and 30 are formed in two rows of three each in respective end strip portions 75 and 76.

In assembling the connector, the elastomer connector 13 is initially preassembled with the base member 11 with outer edge portions of opposite end strip portions 75 and 76 being retained in recesses 27 and 28 by the retaining pins 29 and 30 being received as friction fits in the respective apertures 80, such pins also retaining the elastomer in evenly stressed condition.

Figure 4:
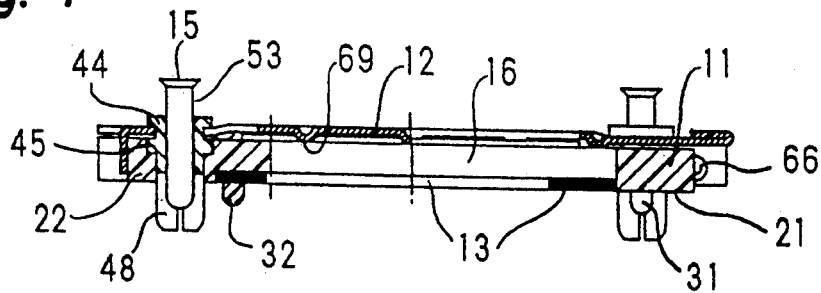
FIG. 4 is a cross-sectional view of the connector assembly taken along line 4—4 of FIG. 1 showing securing devices for anchoring the connector assembly to a circuit board pre-mounted therein.
Figure 5:
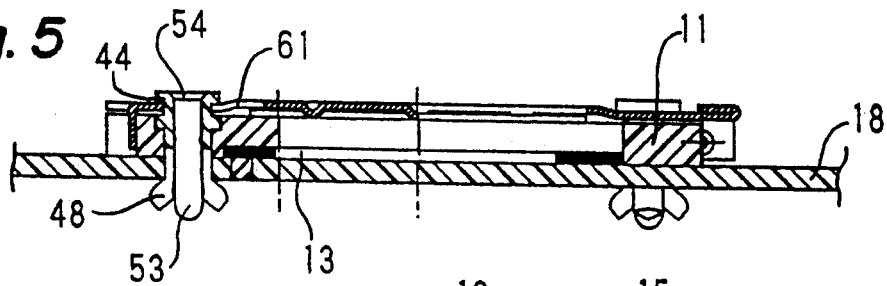
FIG. 5 is a similar cross-sectional view to FIG. 4 with the securing devices in a final, anchoring position, securing the connector assembly to a circuit board.
Figure 6:
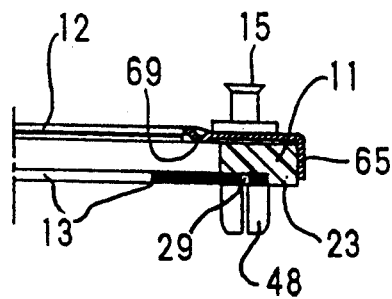
FIG. 6 is a cross-sectional view taken along line 6—6 of FIG. 1.
Figure 7A:
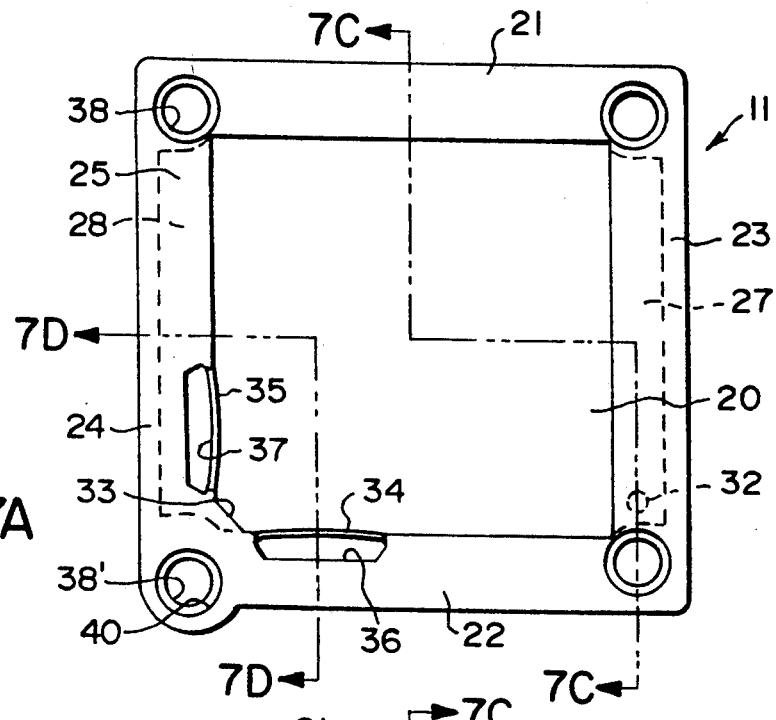
FIG. 7(a), 7(b), 7(c) and 7(d) are, respectively, plan, underplan and cross-sectional views of a base member of the connector, the cross-sectional views being taken along lines 7C—7C and 7D—7D of FIG. 7(a), respectively.
Figure 7B:
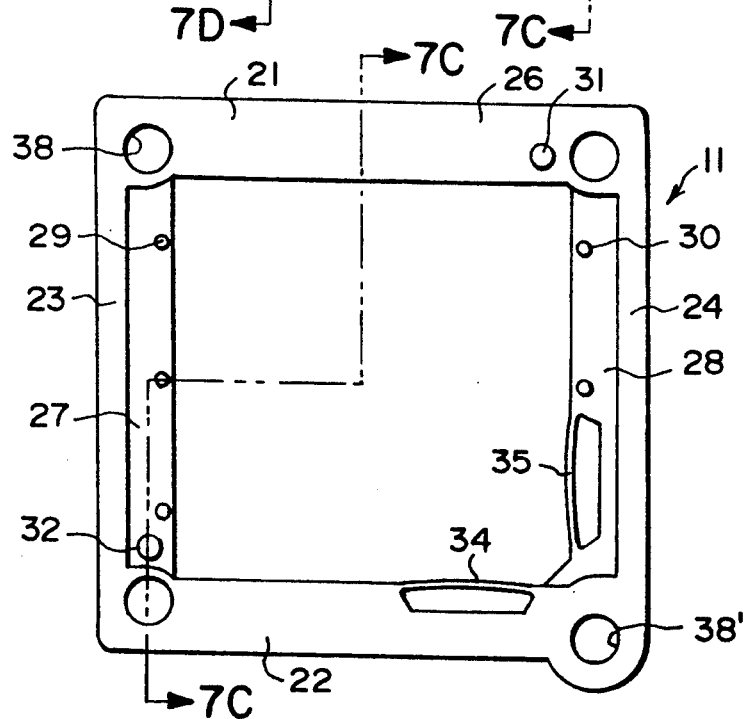
Figure 7C:
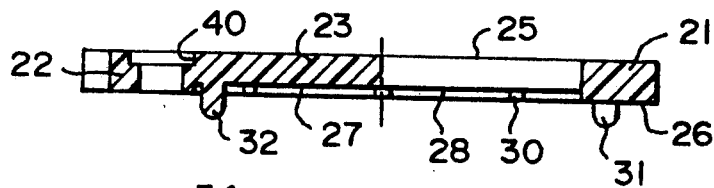
Figure 7D:
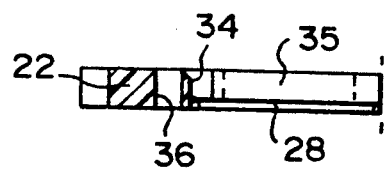

The subassembly so formed is then applied against the surface of the circuit board with the positioning pins 31 and 32 received in locating apertures in the circuit board accurately to align mounting sockets 38,38' with respective anchoring apertures in the circuit board. The outer members 14 of respective securing devices are then mounted in respective mounting sockets 38 and 39' with their lower flange portions 45 seated in the counter-bored portions 15 40 and the beads 51 engaging sides of the mounting sockets 38, 38' prime in a friction fit so that the free ends of the shanks 42 protrude from the lower face 26 of the base member below the circuit board aperture, as shown in FIG. 4. Each inner member 15, (which may have been pre-mounted in the passageway 43 of an outer member by receipt as a force fit with the annular rib 52), is then pushed fully into a passageway 43, engaging the camming surfaces 50 to spread the resilient legs 48 apart underneath the circuit board engaging edges of the aperture, thereby securely anchoring the base member on the circuit board.

In the final anchoring position, the head 54 of the inner member 15 is flush with the upper surface of flange 44.

It will be appreciated that if a backing plate is utilized under the circuit board, any securing device must be longer than that illustrated.

Accurate initial mounting of the circuit board is also facilitated by frictional engagement of the respective beads 51 with edges of the aperture of the circuit board.

Alternatively, a subassembly of the inner and outer securing devices mounted in the base member may be applied to the circuit board.

The LGA device can be inserted in the central aperture of the base member through the upper face thereof either prior or subsequent to mounting the base member on the circuit board. The tapered edges of the beam springs 34 and 35 ensure easy entry of the LGA device into the socket, if correctly oriented, adjacent edges of the LGA device engaging respective beam springs 34 and 35 to deform them outwardly, with the result that their resiliency urges the opposite corner of the LGA device against the opposite corner of the base member, which therefore functions as the cardinal point A, ensuring accurate final positioning of the LGA device automatically on insertion.

The cover member 12 is then detachably mounted on the base member 11 from above, initially by free receipt of the upper flanges 44 of the outer securing devices in entry portions 61 of the mounting apertures 60, 60. The cover member 12 is then moved laterally, with engagement of an assembler's finger with leading edge 67 depressing such edge, sliding the cover member across the base member, guided by flanges 64 and 65 throughout such movement until the edges of the retaining slot portions 62 enter the grooves or necks 46 and are lodged under the flanges 44. L-shaped guiding recesses or grooves, (not shown), may be formed to extend along outer edges of side walls 23 and 24 for receiving and guiding the protuberances 66 throughout such movement.

During such movement, the beads 69, respectively, engage an upper face of the LGA device causing resilient flexure of the cover plate, which results in a spring force urging lands 17 on the lower contact face of the LGA device against the elastomer connector to effect a pressure connection therewith.

The cover member is retained in the final, connecting position by engagement of the stop flange 23 with the side wall 22 and by the beads 66 catching front wall 21 at the corners with end walls 23 and 24 in a detent action.

It will be readily appreciated that the cover member may be easily moved in the opposite direction to release the LGA device by exerting appropriate pressure on the leading edge portion 67.

The example of the invention provides several important advantages. The elastomer connector can be quickly and accurately preassembled on the base member merely by press fitting with the retaining pins while the base member can also be initially positioned on the circuit board and anchored therein quickly and accurately by operation of the securing devices, which does not involve time consuming manipulation of screw but only a simple pressing action.

An important aspect of the invention is the accurate positioning of the LGA device, automatically, with reference to a cardinal point by the cooperative engagement with the beam spring members 31 which also afford easy manual insertion and initial retention of the LGA device in the base member. Therefore, Lands 17 of the LGA device are automatically in precise alignment electrically to connect the correct conductive pads on the circuit board through the elastomer connector simply by placing the LGA device in the central aperture of the base member and locating the base member on the circuit board.

A further advantage is that the socket connector requires only three separate parts when the securing members are pre-mounted in the base member.

In addition to the securing devices affording extremely easy and quick mounting of the socket connector on the circuit board any problems associated with over tightening of screw-fastenings are obviated.

The utilization of an elastomer connector together with the receipt of the LGA device completely within the profile of the frame of the base member, receipt of the inner member 15 of the securing device completely within the outer member 14 when the socket is anchored in the circuit board, and the essentially laminar form of the cover member ensure that the connector can be of extremely low profile, occupying minimal above-board space, while the assembly and disassembly of the cover member by a sliding action parallel to the board also enables assembly and disassembly in areas where above-board space is extremely restricted.

In the example of the invention, the miniaturization is such that the total height of the assembled connector above the circuit board is less than one fifth of an inch.

We claim:

1. A low profile socket connector for mounting an LGA device on a circuit board comprising:
    a base member comprising a rectangular housing from having upper and lower faces and opposite side walls and opposite end walls defining between them a socket opening to the upper and lower faces for receiving the LGA device in substantially coplanar relation therein with the contact land array of the LGA device exposed to the lower face, resilient biasing means protruding into the socket resiliently for engagement with at least one side edge portion of the LGA device to bias the LGA device laterally, in a direction in its plane into a predetermined reference position in the base member;
    an interface pressure connecting device comprising an elastomer connector positionable between a lower face of the LGA device and a circuit board;
    frictional retention means provided on the base member adjacent a lower face thereof for retaining the elastomer connector thereon prior to assembly with a circuit board; and,
    means for securing the base member to the circuit board with the interface device passed between respective contact lands of the LGA device and conductive pads of the circuit board to establish electrical connection therebetween.

2. A low profile socket connector according to claim 1, in which the retaining means includes elastomer connector receiving recesses, opening to the lower face, formed in respective opposite walls of the base member.

3. A low profile socket connector according to claim 1, in which the base member is made in one piece of plastic and the resilient biasing means comprises at least one resilient plastic portion integrally formed with at least one inner edge portion of a rigid wall of the base member frame and is arranged to bias the LGA device in a coplanar direction.

4. A low profile socket connector for a LGA device according to claim 3, in which the said at least one resilient plastic portion comprises at least one beam spring member protruding into the socket.

5. A low profile socket connector according to claim 3, in which said at least one resilient plastic portion extends from adjacent inner edge portions of one pair of adjacent rigid walls at a location adjacent a corner of the housing frame and is arranged to urge the LGA device against a corner of the housing frame diametrically opposite to the one corner.

6. A low profile socket connector for a LGA device according to claim 5, in which the said at least one resilient plastic portion comprises two beam spring members extending from respective of the adjacent walls and bowing into the socket.

7. A low profile socket connector according to claim 1, in which the retaining means comprises a plurality of retaining pins integrally formed with at least one wall of the lower face of the base member and extending downwardly therefrom into penetrating engagement with the elastomer connector at spaced apart locations thereof.

8. A low profile socket connector according to claim 7, in which the retaining means includes elastomer connector receiving recesses, opening to the lower face, formed in respective opposite walls of the base member, the retaining pins being positioned in the recesses.

9. A low profile socket connector according to claim 7, in which the elastomer connector is formed with a series of apertures aligned to receive the respective retaining pins in an interference fit.

10. A low profile socket connector according to claim 1, in which walls of the base member are formed with mounting sockets extending between upper and lower faces thereof and the securing means comprises an outer, stud-like member having a head and a shank extending from the head, a free end of the shank being formed with a plurality of axially extending, resilient legs, and a passageway extending axially through the head into the shank; an inner member including a shank extending from a head, the outer member being mountable in the base member with the head secured in the base member and the shank extending through a respective aperture with the legs received in an aperture in the circuit board and the inner member being mountable in the outer member for movement from a first position, in which the shank is partially received in the passageway to a second, anchoring position in which both the head and shank are fully received in the passageway and in which the head of the inner member does not protrude from the passageway with a free end of the shank spreading the legs radially apart into anchoring engagement with the circuit board.

11. A low profile socket connector according to claim 10, in which a constriction is formed at a medial location in the passageway for engagement with the shank of the inner securing member in an interference fit for retaining the inner securing member therein in the first, partly received position.

12. A low profile socket connector according to claim 10, in which free ends of the legs protrude from a lower face of the circuit board and have inner faces formed with camming surfaces engageable by the shank of the inner securing member during movement thereof along the passageway to the anchoring position whereby the free ends of the legs are pivoted apart into anchoring engagement with edges of the aperture at a lower face of the circuit board.

13. A low profile socket connector according to claim 12, further comprising a cover member for mounting on the upper face of the base member, and in which first and second flanges are formed on the head in axially spaced apart relation, defining between them a cover member receiving groove, the first flange being arranged for retaining engagement in the base member and the second flange for retaining the cover member.

14. A low profile socket connector for mounting an LGA device on a circuit board comprising:
  a base member comprising a rectangular housing from having upper and lower faces and opposite side walls and opposite end walls defining between them a socket opening to the upper and lower faces for receiving the LGA device in substantially coplanar relation therein with the contact land array of the LGA device exposed to the lower face, resilient biassing means protruding into the socket resiliently for engagement with at least one side edge portion of the LGA device to bias the LGA device laterally, in a direction in its plane into a predetermined reference position in the base member;
  an interface pressure connecting device positionable between a lower face of the LGA device and a circuit board;
  means for securing the base member to the circuit board with the interface device pressed between respective contact lands of the LGA device and conductive pads of the circuit board to establish electrical connection therebetween;
  a cover member stamped and formed from a single piece of sheet metal and comprising a rectangular, plate-like, resilient frame portion having opposite side walls and opposite end walls, inner edge portions of which overhang corresponding walls of the base member to extend over the socket and are formed with a plurality of protuberances extending at spaced apart locations from a lower face thereof, into the socket;
  a plurality of key-hole type mounting apertures having wide entry points communicating with narrow slot-like retention portions formed in the cover member,
  the securing means comprising stud-like members each having shanks extending from cover member retaining heads;
  whereby the cover member can be located on the base member in a first position in which the heads are freely received in the respective entry portions of the mounting apertures and, subsequently, urged along the base member in a sliding action, parallel to the circuit board, to a second, fastening position in which the shanks are received in the retention portions and the protuberances engage an upper face of an LGA device in the socket with flexure of the cover plate, the resiliency thereof pressing the LGA device against the interface connecting device.

15. A low profile socket connector according to claim 14, in which the cover member is formed with guiding flanges which depend from opposite outer edges of two, opposite walls thereof and are slidably engageable with outer edges of opposite walls of the base member during movement of the cover member to the fastening position.

16. A low profile socket connector according to claim 15, in which a stop flange depends downwardly from an outer, trailing edge of a third wall of the cover member and is aligned for engagement with an end wall of the base for arresting movement of the cover member in the fastening position and an inwardly protruding catch forming protuberance is formed on at least one of the guiding flanges at a location adjacent the outer, leading edge of the fourth wall for catching engagement, in a detent action, with a leading edge portion of a wall of the base member on sliding movement of the cover member into the fastening position.

17. A low profile socket connector according to claim 16, in which a leading outer edge portion of the fourth wall of the cover member is reversely bent to double thickness providing a finger engageable portion.

18. A low profile socket connector for mounting an LGA device on a circuit board comprising:
- a base member comprising a rectangular housing frame having upper and lower faces and opposite side walls and opposite end walls defining between them a socket opening to the upper and lower faces for receiving the LGA device in substantially coplanar relation therein with the contact land area of the LGA device exposed to the lower face, mounting sockets extending through the frame between upper and lower faces thereof;
- an interface pressure connecting device positionable between a lower face of the LGA device and a circuit board;
- a cover member for mounting on the upper face of the base member; and,
- means for securing the cover member and the base member to the circuit board with the interface device pressed between respective contact lands of the LGA device and conductive pads of the circuit board to establish electrical connection therebetween, the securing means comprising an outer member and an inner member, the outer member having a shank formed with an internal, axially extending passageway and, at one end, with a plurality of axially extending, resilient legs and the inner member including a shank, the outer member being mountable in the base member mounting sockets with the legs received in an aperture in the circuit board, and the inner member being mountable in the outer member for movement from a first position in which the shank is partially received in the passageway to a second, anchoring position in which the shank is fully received in the passageway with a free end thereof spreading the legs radially apart into anchoring engagement with the circuit board.

19. A low profile socket connector according to claim 18, in which the through-bore of the outer member is formed at a medial location with a constriction engageable with the shank of the inner securing member in an interference fit for retaining the inner securing member therein in the partially inserted position.

20. A low profile socket connector according to claim 18, in which free ends of the legs protrude from a lower face of the circuit board and have inner faces formed with camming surfaces engageable by the shank of the inner securing member during movement thereof along the passageway to the anchoring position whereby the free ends of the legs are pivoted apart into anchoring engagement with a lower face of the circuit board.

21. A low profile socket connector according to claim 20, in which the other end of the outer member is formed with a head secured in the base member and the head is formed with a transversely extending cover member receiving groove.

22. A low profile socket connector according to claim 21, in which the head comprises first and second, axially spaced flanges defining the groove between them, the second flange being secured to the base member.

23. A low profile socket connector for mounting an LGA device on a circuit board comprising:
- a base member comprising a rectangular housing frame having upper and lower faces and opposite side walls and opposite end walls defining between them a socket opening to the upper and lower faces for receiving the LGA device in substantially coplanar relation therein with the contact land array of the LGA device exposed to the lower face,
- an interface pressure connecting device comprising an elastomer connector positionable between a lower face of the LGA device and a circuit board;
- elastomer connector retaining means comprising a plurality of retaining pins integrally formed with at least one wall of the lower face of the base member and extending downwardly therefrom into penetrating engagement with the elastomer connector at spaced apart locations thereof for retaining the interface pressure connector device thereon prior to assembly with a circuit board; and,
- means for securing the cover member and the base member to the circuit board with the interface pressure connecting device pressed between respective contact lands of the LGA device and conductive pads of the circuit board to establish electrical connection therebetween.

24. A low profile socket connector according to claim 23, in which the retaining means includes elastomer connector receiving recesses formed in respective opposite walls of the base member and opening to the lower face, the retaining pins being positioned in the recesses.

25. A low profile socket connector according to claim 23, in which the elastomer connector is formed with a series of apertures aligned to receive the respective retaining pins in an interference fit.

26. A low profile socket connector for mounting an LGA device on a circuit board comprising:
- a base member comprising a rectangular housing frame having upper and lower faces and opposite side walls and opposite end walls defining between them a socket opening to the upper and lower faces for receiving the LGA device in substantially coplanar relation therein with the contact land array of the LGA device exposed to the lower face, an interface pressure connecting device positionable between a lower face of the LGA device and a circuit board;
- frictional retention means provided for the base member adjacent the lower face thereof for retaining the interface pressure connecting device thereon prior to assembly with a circuit board; and,
- means for securing the cover member and the base member to the circuit board with the interface pressure connecting device pressed between respective contact lands of the LGA device and conductive pads of the circuit board to establish electrical connection therebetween.

27. A low profile socket connector according to claim 26, including a cover member comprising a resilient metal plate mountable on the upper face of the base member and formed with means for engaging an upper face of an LGA device in the socket with resilient flexure of the plate thereby urging the lower face of the LGA device against the interface connector.

28. A low profile socket connector for mounting an LGA device on a circuit board comprising:
a base member comprising a rectangular housing fame having upper and lower faces and opposite side walls and opposite end walls defining between them a socket opening to the upper ad lower faces for receiving the LGA device in substantially coplanar relation therein with the contact land array of the LGA device exposed to the lower face, resilient biassing means protruding into the socket resiliently for engagement with at least one side edge portion of the LGA device to bias the LGA device laterally, in a direction in its plane into a predetermined reference position the base member;
an interface pressure connecting device comprising an elastomer connector for location between a lower face of the LGA device and a circuit board;
an elastomer connector retaining means comprises a plurality of retaining pins integrally formed with at least one wall of the lower face of the base member and extending downwardly therefrom into penetrating engagement with the elastomer connector at spaced apart locations thereof; and,
means for securing the base member to the circuit board with the elastomer connector pressed between respective contact lands of the LGA device and conductive pads of the circuit board to establish electrical connection therebetween.

29. A low profile socket connector according to claim 28, in which the retaining means includes elastomer connector receiving recesses, opening to the lower face, formed in respective opposite walls of the base member, the retaining pins being positioned in the recesses.

30. A low profile socket connector according to claim 28, in which the elastomer connector is formed with a series of apertures aligned to receive the respective retaining pins in an interference fit.

31. A low profile socket connector for mounting an LGA device on a circuit board comprising:
a base member made in one piece of plastic and comprising a rectangular housing frame having upper and lower faces and opposite side walls and opposite end walls defining between them a socket opening to the upper and lower faces for receiving the LGA device in substantially coplanar relation therein with the contact land array of the LGA device exposed to the lower face, resilient biassing means comprising at least one beam spring member integrally formed with at least one inner edge portion of a rigid wall of the base member frame protruding into the socket resiliently for engagement with at least one side edge portion of the LGA device to bias the LGA device laterally, in a coplanar direction into a predetermined reference position in the base member;
an interface pressure connecting device positionable between a lower face of the LGA device and a circuit board; and,
means for securing the base member to the circuit board with the interface device pressed between respective contact lands of the LGA device and conductive pads of the circuit board to establish electrical connection therebetween.

32. A low profile socket connector for mounting an LGA device on a circuit board comprising:
a base member made in one piece of plastic and comprising a rectangular housing frame having upper and lower faces and opposite side walls and opposite end walls defining between them a socket opening to the upper and lower faces for receiving the LGA device in substantially coplanar relation therein with the contact land array of the LGA device exposed to the lower face, resilient biassing means comprising two beam spring members integrally formed with an denting from respective adjacent inner edge portions of one pair of adjacent rigid walls at a location adjacent one corner of the housing frame and bowing into the socket for resilient engagement with at least one side edge portion of the LGA device to bias the LGA device laterally, in a coplanar direction against a corner of the housing frame diametrically opposite to the one corner into a predetermined reference position in the base member;
an interface pressure connecting device positionable between a lower face of the LGA device and a circuit board; and,
means for securing the base member to the circuit board with the interface device pressed between respective contact lands of the LGA device and conductive pads of the circuit board to establish electrical connection therebetween.

33. A low profile socket connector for mounting for LGA device on a circuit board comprising:
a base member comprising a rectangular housing frame having upper and lower faces and opposite side walls and opposite end walls defining between them a socket opening to the upper and lower faces for receiving the LGA device in substantially coplanar relation therein with the contact land array of the LGA device exposed to the lower face, one pair of adjacent walls being rigid and having inner surfaces for abutment with one corner of the LGA device, the entire inner surface being rigid, and defining a predetermined reference position, resilient biassing means provided on another wall and protruding into the socket for resilient engagement with at least one side edge portion of the LGA device remote from the one corner to bias the LGA device laterally, in a direction in its plane so that the one corner abuts the inner surface, in the predetermined reference position;
an interface pressure connecting device positionable between a lower face of the LGA device and a circuit board; and,
means for securing the base member to the circuit board with the elastomer connector pressed between respective contact lands of the LGA device and conductive pads of the circuit board to establish electrical connection therebetween.

34. A low profile socket connector for mounting an LGA device on a circuit board comprising:
a base member comprising a rectangular housing frame having upper and lower faces and opposite side walls and opposite end walls defining between them a socket opening to the upper and lower faces for receiving the LGA device in substantially coplanar relation therein with the contact land array of the LGA device exposed to the lower face, resilient biassing means protruding into the socket resiliently for engagement with at least one side edge portion of the LGA device to bias the LGA device laterally, in a direction in its plane into a predetermined reference position in the base member;

an interface pressure connecting device comprising an elastomer connector for location between a lower face of the LGA device and a circuit board;

an elastomeric connector retaining means including elastomer connector receiving recesses, opening to the lower face, formed in respective opposite walls of the base member adjacent a lower face thereof for retaining the elastomer connector thereon prior to assembly with a circuit board; and, means for securing the base member to the circuit board with the interface device pressed between respective contact lands of the LGA device and conductive pads of the circuit board to establish electrical connection therebetween.

35. A low profile socket connector for mounting an LGA device on a circuit board comprising:

a base member comprising a rectangular housing frame having upper and lower faces and opposite side walls and opposite end walls defining between them a socket opening to the upper and lower faces for freely receiving the LGA device in substantially coplanar relation therein with the contact land array of the LGA device exposed to the lower face, one pair of adjacent walls being rigid and having rigid inner surface portions extending for their entire length and defining a predetermined reference position for the LGA device in the base member, resilient biassing means carried by at least one other wall and protruding into the socket resiliently for engagement with at least one side edge portion of the LGA device to bias the LGA device laterally, in a direction in its plane into engagement with said inner surface portions and thereby into the predetermined reference position in the base member;

an interface pressure connecting device positionable between a lower face of the LGA device and a circuit board; and, means for securing the base member to the circuit board with the interface device pressed between respective contact lands of the LGA device and conductive pads of the circuit board to establish electrical connection therebetween.

* * * * *